United States Patent [19]

New

[11] Patent Number: 5,796,269
[45] Date of Patent: Aug. 18, 1998

[54] COMPOSABLE MEMORY ARRAY FOR A PROGRAMMABLE LOGIC DEVICE AND METHOD FOR IMPLEMENTING SAME

[75] Inventor: Bernard J. New, Los Gatos, Calif.

[73] Assignee: Xilinx, Inc., San Jose, Calif.

[21] Appl. No.: 631,298

[22] Filed: Apr. 9, 1996

[51] Int. Cl.[6] .................................................. H03K 7/38
[52] U.S. Cl. .................................. 326/40; 326/41
[58] Field of Search .............................. 326/40, 41, 46; 365/189.04, 230.05, 230.03

[56] References Cited

U.S. PATENT DOCUMENTS

| | | | |
|---|---|---|---|
| 4,825,414 | 4/1989 | Kawata | 326/40 |
| 5,042,004 | 8/1991 | Agrawal et al. | 326/40 |
| 5,343,406 | 8/1994 | Freeman et al. | 326/40 |
| 5,414,377 | 5/1995 | Feidin | 326/40 |
| 5,583,450 | 12/1996 | Trimberger et al. | 326/40 |

OTHER PUBLICATIONS

"XC4000™ Series Advanced Product Information Data Sheet", dated Feb. 2, 1996 available from Xilinx, Inc., 2100 Logic Drive, San Jose, CA 95124.

*Primary Examiner*—Stephone B. Allen
*Assistant Examiner*—Richard Roseen
*Attorney, Agent, or Firm*—E. Erich Hoffman; Bever & Hoffman; Jeanette S. Harms

[57] ABSTRACT

A composable memory array for a programmable logic device includes a plurality of dedicated, serially coupled memory tiles. Each memory tile includes a plurality of dual-port memory cells, each having a first port and a second port, a plurality of first bit lines coupled to the first ports and a plurality of second data lines coupled to the second ports. The first and second bit lines extend across memory tiles. Each memory tile includes a plurality of first configuration circuits which allow the first bit lines of the memory tile to be coupled to the first bit lines of the previous memory tile. Thus, any number of consecutive memory tiles can be concatenated to form a memory array using the first set of bit lines. Non-consecutive memory tiles include a plurality of second configuration circuits which allow the second bit lines of the memory tile to be coupled to the second bit lines of a previous memory tile.

21 Claims, 9 Drawing Sheets

COMPOSABLE MEMORY ARRAY FOR A PROGRAMMABLE LOGIC DEVICE AND METHOD FOR IMPLEMENTING SAME

BACKGROUND OF THE INVENTION

This invention relates to a structure and method of implementing a memory array in a programmable logic device.

DESCRIPTION OF THE PRIOR ART

Programmable logic devices (PLDs) typically include an array of configurable logic blocks (CLBs). Each CLB includes logic which is programmed to perform a particular function or functions desired by the user of the PLD. In particular PLDs, such as Xilinx's XC4000™ family of devices, writable RAM-based look-up tables are included in each CLB. The writable RAM-based look-up tables can be used to create a "user-RAM" array. However, such user-RAM arrays are inefficient because creation of the RAM array detracts from the amount of logic available to perform other operations within the PLD. That is, when a CLB is used to create user-RAM array, the logic capacity of the CLB is lost.

Moreover, the RAM arrays which can be conveniently created using the writable RAM-based look-up tables are relatively small (e.g., capable of storing only 16 to 32 bytes). To expand a RAM array (e.g., to more than 16 or 32 bytes), function generators of additional CLBs are required to perform a multiplexing function between the several smaller RAM arrays. As a result, the complexity of the signal routing for the RAM array increases, the amount of logic required by the RAM array increases, and the speed of the RAM array decreases.

For example, when implementing a 256-byte RAM, the CLB area consumed is roughly equivalent to the area of a conventional PLD. While a 256-byte RAM may seem like a large memory to implement using a PLD, such a RAM is still relatively small.

Moreover, the layout area required to make each RAM-based look-up table writable is not an insignificant percentage of the layout area of each CLB. This area penalty is incurred by each CLB, irrespective of whether it is used to create a user-RAM array. The total area penalty for a PLD depends on the size of the PLD and can be equal to the area of 100 or more CLBS.

Accordingly, it would be desirable to have a PLD which implements a user-RAM array and overcomes the problems previously discussed.

SUMMARY

In accordance with one embodiment of the invention, a PLD includes a dedicated, composable memory array and a separate CLB array. The CLBs in the CLB array include non-writable RAM-based look-up tables, but do not include writable RAM-based look-up tables. The area saved by removing the writable RAM-based look-up tables from the CLBs in the CLB array provides adequate area for the composable memory array and/or a reduction in overall die size, without impacting the logic capacity of the CLB array.

In accordance with another embodiment of the invention, a semiconductor device having a composable memory array is provided. The composable memory array includes a plurality of dedicated, serially coupled memory tiles. Each memory tile includes a plurality of dual-port memory cells which are accessible through either a first port or a second port. The first ports of the memory cells are coupled to a plurality of first bit lines, and the second ports of the memory cells are coupled to a plurality of second bit lines. The first and second bit lines extend across the plurality of memory tiles in a switchable configuration. By controlling the length of the bit lines, the size of the resulting memory array is controlled.

Each of the memory tiles includes a plurality of first configuration circuits which are programmable to connect (or disconnect) the first bit lines of the associated memory tile with the first bit lines of a previous memory tile. Because the first configuration circuits are present in each memory tile, the size of the memory array can be programmed to include any integer number of consecutive memory tiles. That is, any number of consecutive memory tiles can be concatenated to form a memory array using the first configuration circuits and the first bit lines. This advantageously provides for flexibility in determining the size of the memory array to be used.

Non-consecutive memory tiles include a plurality of second configuration circuits which are programmable to connect (or disconnect) the second bit lines of the associated memory tile with the second bit lines of a previous memory tile. The second bit lines are continuous between the non-consecutive memory tiles. The second bit lines therefore allow pre-defined blocks of memory tiles to be concatenated. The second bit lines and second configurations circuits are preferable for forming larger memory arrays because the second configuration circuits, being fewer in number than the first configuration circuits, introduce a smaller signal delay on the second bit lines.

In addition to controlling the size of the composable RAM array, the configuration circuits also allow the composable RAM array to be divided into a plurality of separate memories.

The present invention will be more fully understood in light of the following detailed description taken together with the drawings.

BRIEF DESCRIPTION OF THE DRAWINGS

FIG. 4, which consists of FIGS. 4a and 4b, is a schematic diagram of a memory tile in accordance with one embodiment of the invention;

DETAILED DESCRIPTION

Figure 1:
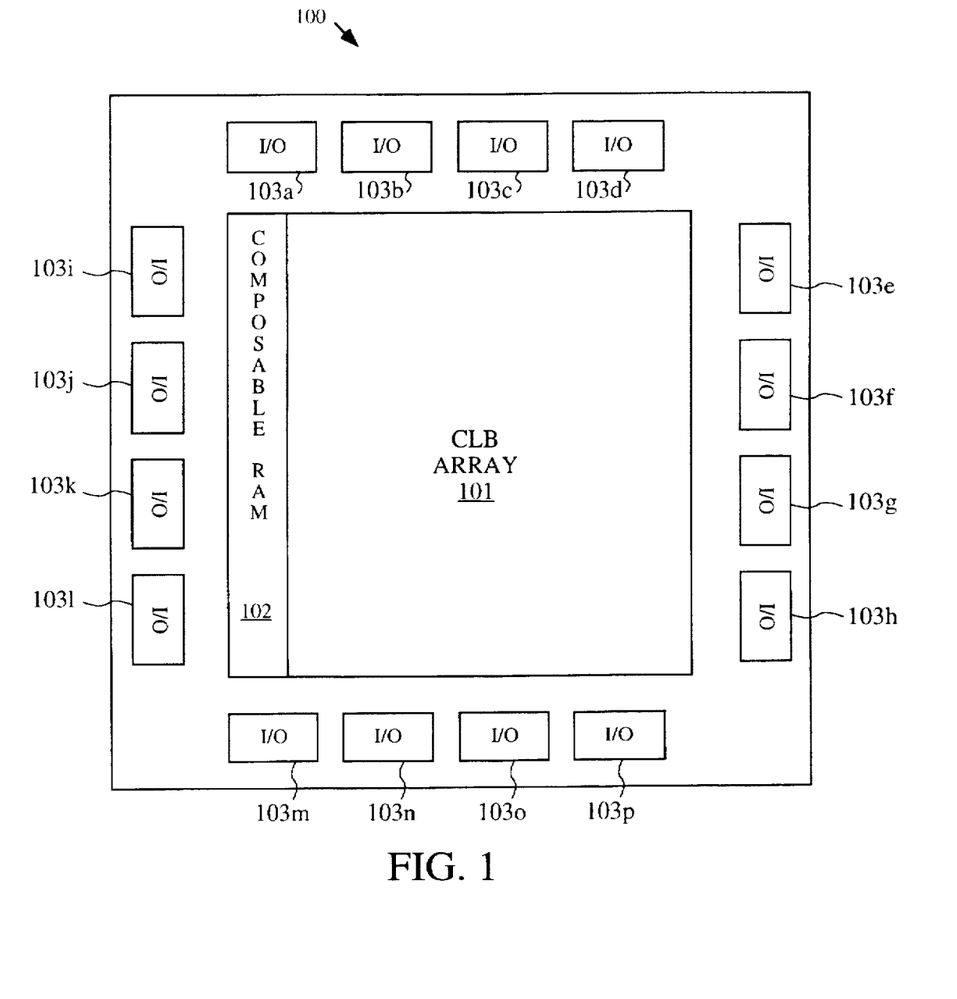
FIG. 1 is a diagram of a PLD in accordance with one embodiment of the present invention.

FIG. 1 is a diagram of a PLD 100 in accordance with one embodiment of the present invention. PLD 100 includes CLB array 101, composable RAM array 102 and input/output (I/O) blocks 103a–103p. CLB array 101 includes a plurality of conventional CLBs which do not include writable RAM-based look-up tables. General information concerning the operation and interaction of a CLB array and I/O blocks is provided in Xilinx's XC4000™ data sheet, which is hereby incorporated by reference in its entirety. Composable RAM array 102 is physically located at a dedicated area on PLD 100 and, in the embodiment illustrated, consumes approximately ⅛th to ¹/₁₀th of the area of the logic of PLD 100. In other embodiments, composable RAM array 102 constitutes a higher or lower percentage of the total logic on PLD 100, depending on the particular application of PLD 100. As used herein, the term "composable RAM array" refers to a memory array which is partitionable into one or more smaller memory arrays by the user of the PLD, with each of these smaller memory arrays having a selectable storage capacity. I/O blocks 103a–103p are conventional elements which provide for connections between PLD 100 and circuitry external to PLD 100.

Figure 2:
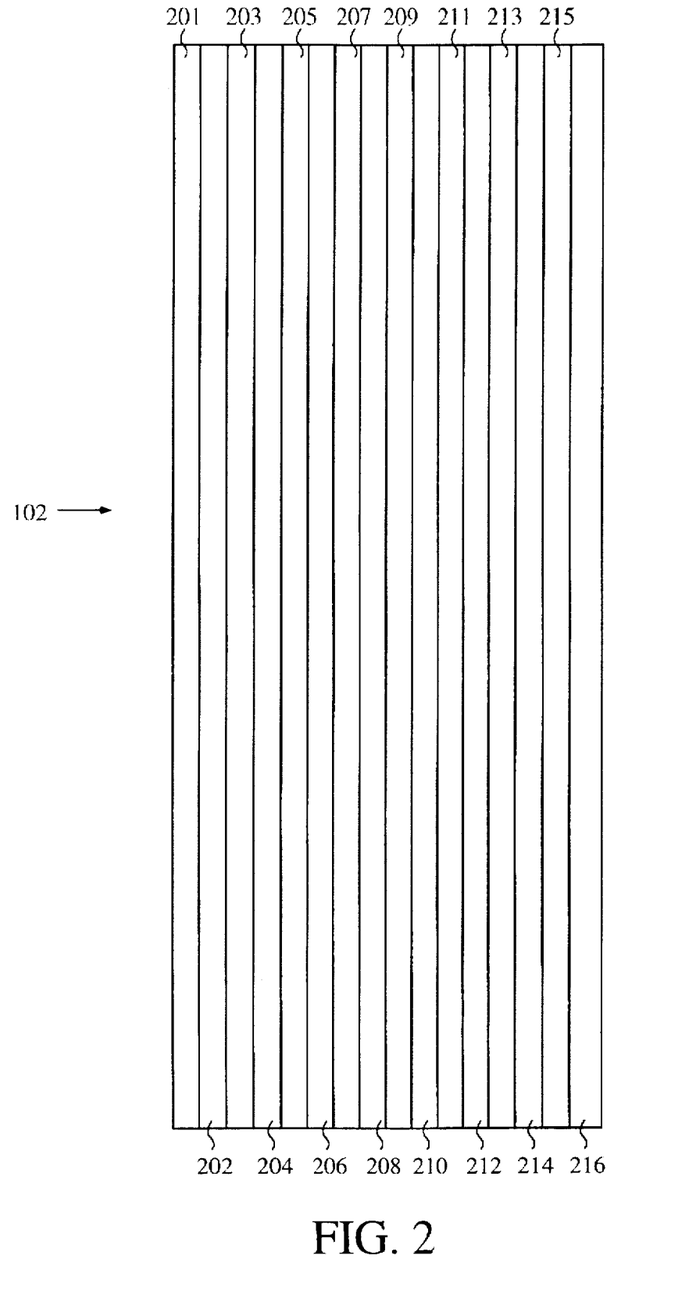
FIG. 2 is a diagram of a composable RAM array which includes a plurality of composable RAM stripes.

FIG. 2 is a diagram of composable RAM array 102, which includes a plurality of composable RAM elements, here called stripes 201–216. Although sixteen composable RAM stripes 201–216 are illustrated in FIG. 2, this number is illustrative and not limiting. In the described embodiment, each of composable RAM stripes 201–216 is capable of storing up to 256 bytes of data, with each byte having 8 bits. Each of composable RAM stripes 201–216 is independent from the other composable RAM stripes. For example, there are no hard-wired connections between RAM stripe 201 and any of the other RAM stripes 202–216. In the illustrated embodiment, composable RAM array 102 has a total capacity of 4096 bytes (256 bytes/stripe×16 stripes). Thus, dedicated composable RAM array 102 provides a relatively large memory capacity without consuming an excessive area of PLD 100.

Figure 3:
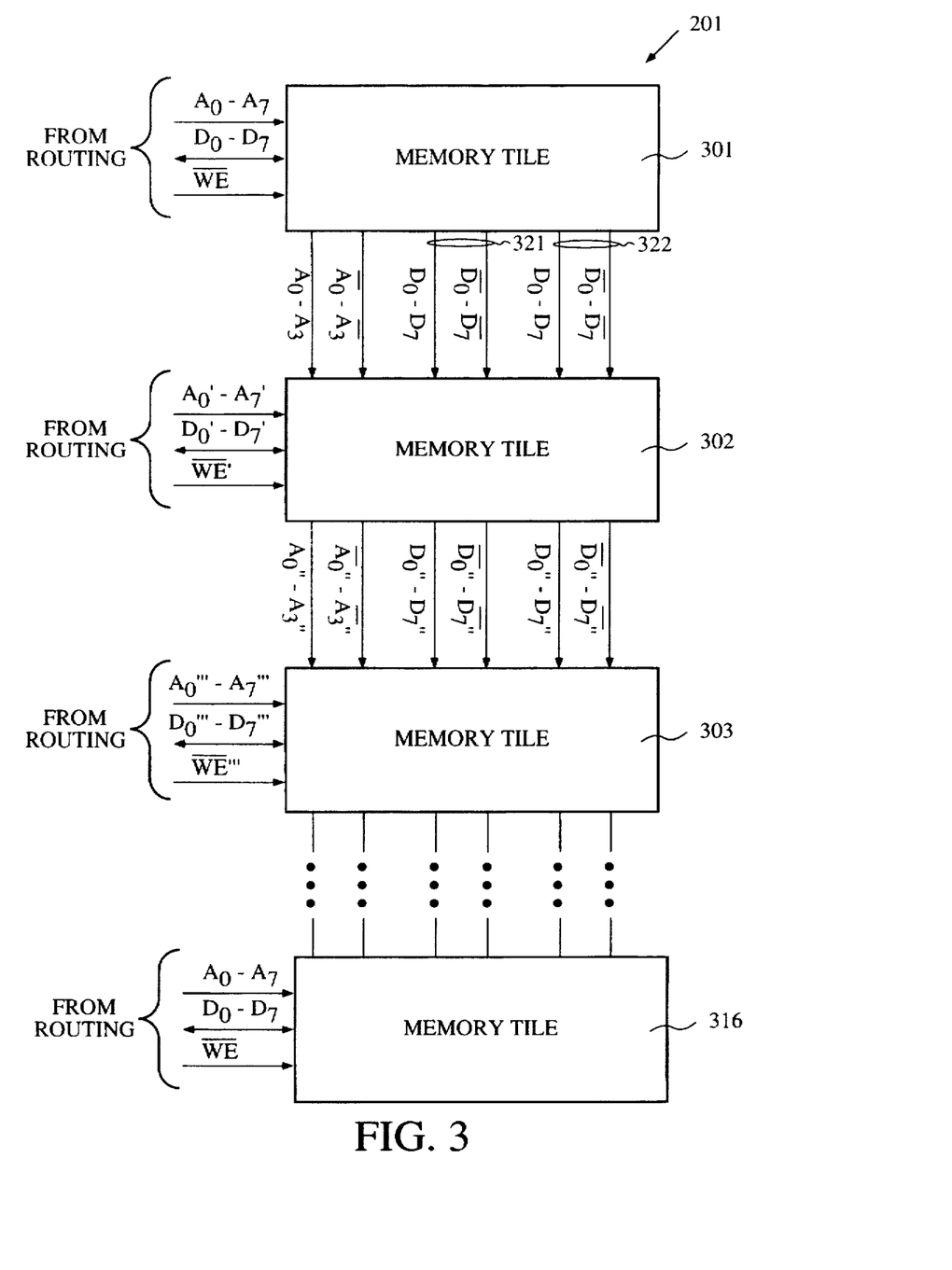
FIG. 3 is a block diagram of one of the composable RAM stripes of FIG. 2.

FIG. 3 is a block diagram of one composable RAM stripe 201. Because composable RAM stripes 202–216 are identical to composable RAM stripe 201, only composable RAM stripe 201 is described in detail.

Composable RAM stripe 201 includes sixteen RAM memory elements, herein referred to as tiles 301–316. Each of memory tiles 301–316 has a storage capacity of 16, wherein each byte has 8 bits. Memory tiles 301–316 are each coupled to conventional routing circuitry (not shown) within PLD 100, such that each of memory tiles 301–316 is capable of receiving a set of address signals, a set of data signals and a write enable signal. For example, memory tile 301 receives address signals $A_0$–$A_7$, data signals $D_0$–$D_7$ and write enable signal $\overline{WE}$ from the routing circuitry. Because each of memory tiles 301–316 is capable of receiving separate address, data and write enable signals from the routing circuitry, each of memory tiles 301–316 is capable of operating as an independent 16-byte memory array.

Figure 4A:
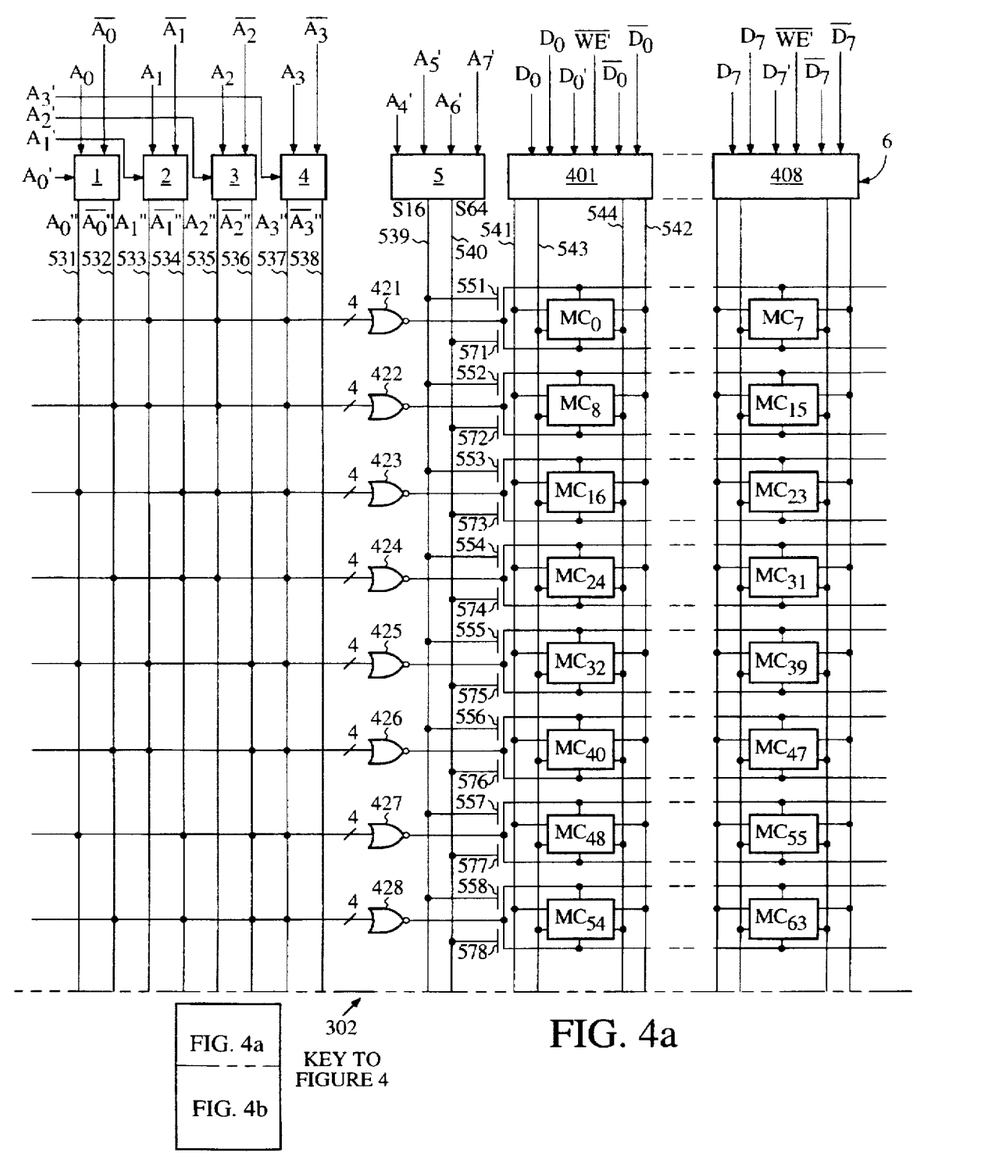
Figure 4B:
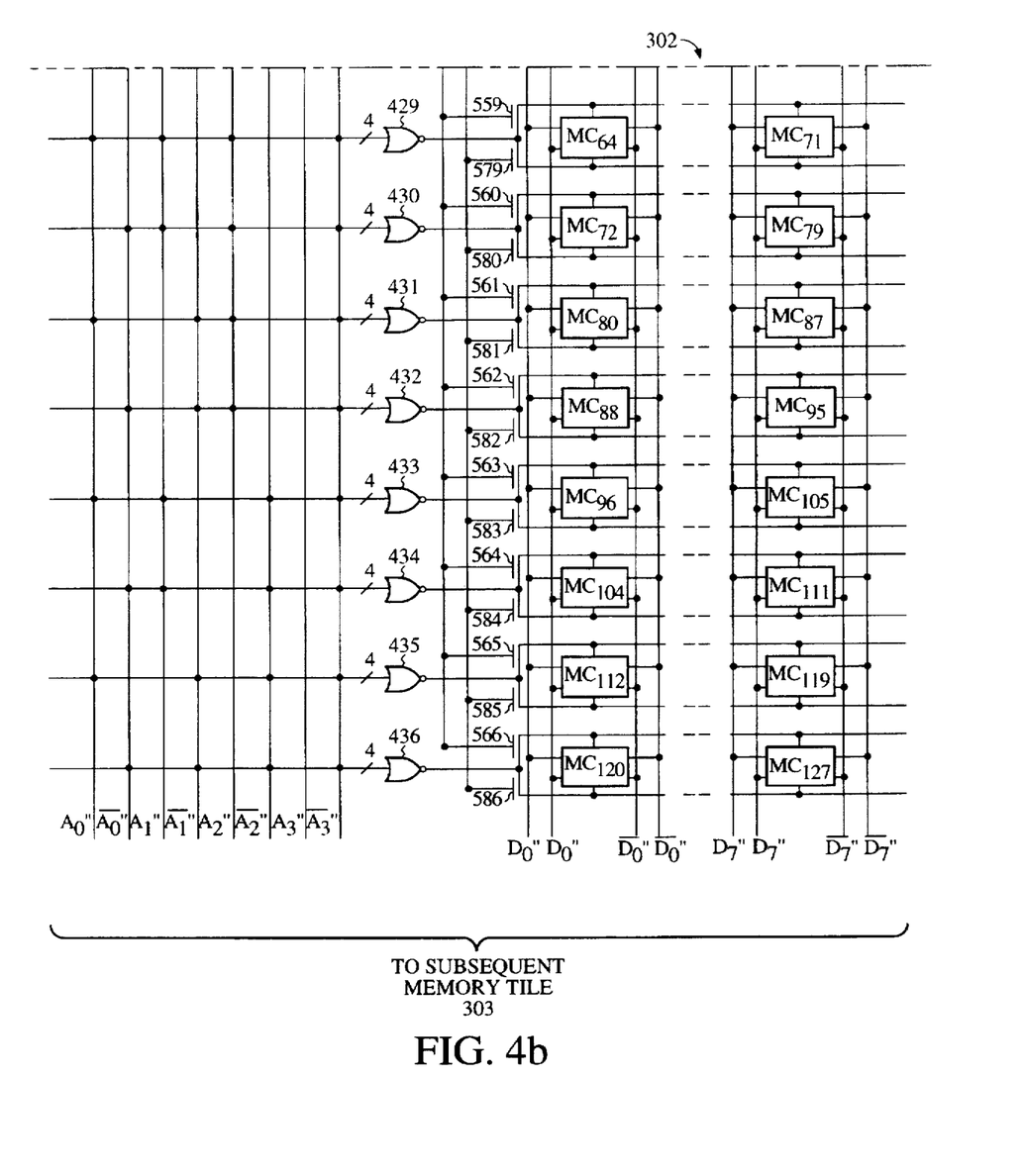

Furthermore, two or more of memory tiles 301–316 can be concatenated to allow RAM memory stripe 201 to operate as a single memory having a capacity of up to 256 bytes. For example, to create a 32 byte memory, memory tiles 301 and 302 can be concatenated. In such an example, address signals $A_0$–$A_7$, data signals $D_0$–$D_7$ and write enable signal $\overline{WE}$ are provided to memory tile 301. As described in more detail below, circuitry within memory tile 302 can be programmed to operate in response to the same signals received by memory tile 301. Any number of consecutive memory tiles 301–316 can be concatenated with memory tile 301 to form a memory array which operates in response to the signals received by memory tile 301. FIG. 4, which consists of FIGS. 4a and 4b as illustrated, is a schematic diagram of memory tile 302. Memory tiles 301 and 303–316 are substantially identical to memory tile 302. Memory tile 301 does not require all of the circuitry present in memory tiles 302–316 because memory tile 301 does not receive signals directly from a previous memory tile in the same manner as memory tiles 302–316. Thus, memory tile 301 may be fabricated without this additional circuitry. Alternatively, memory tile may be fabricated with this additional circuitry, but this additional circuitry may be programmed to pass only the signals $A_0$–$A_7$, $D_0$–$D_7$ and $\overline{WE}$ received from the routing circuitry. Memory tile 302 includes a block of inter-tile logic 6 which includes address bit selection circuits 1–4, memory tile selection circuit 5, and bit line selection circuits 401–408. Because bit line selection circuits 401–408 are substantially identical, only bit line selection circuits 401 and 408 are shown for purposes of clarity. Memory tile 302 also includes NOR gates 421–436, dual-port SRAM cells $MC_0$–$MC_{127}$ (only some of which are shown), word select lines 531–538, port select lines 539–540 and data lines 541–544. Memory tile 302 receives address signals $A_0$–$A_3$ and $\overline{A_0}$–$\overline{A_3}$ and data signals $D_0$–$D_7$ and $\overline{D_0}$–$\overline{D_7}$ from previous memory tile 301. Memory tile 302 also receives address signals $A_0'$–$A_7'$, data signals $D_0'$–$D_7'$ and write enable signal $\overline{WE}'$ from routing circuitry.

In general, address bit selection circuits 1–4 select between the address signals received from memory tile 301 and the address signals received from the routing circuitry to provide the address signals $A_0''$–$A_3''$ and $\overline{A_0}''$–$\overline{A_3}''$ to word select lines 531–538. Address signals $A_0''$–$A_3''$ and $\overline{A_0}''$–$\overline{A_3}''$ are decoded by NOR gates 421–436 to perform a row selection function.

Memory tile selection circuit 5 compares address signals $A_4'$–$A_7'$ with a pre-programmed tile address to determine whether memory tile 302 is being addressed. If memory tile 302 is being addressed, memory tile selection circuit 5 also determines whether dual-port SRAM cells $MC_0$–$MC_{127}$ will be accessed through their first or second ports by providing a port selection signal (e.g., $S_{16}$ or $S_{64}$) on one of port select lines 539 and 540.

Bit line selection circuits 401–408 are programmed either to accept data values $D_0'$–$D_7'$ and write enable signal $\overline{WE}'$ from the routing circuitry, or to accept data values $D_0$–$D_7$ from previous memory tile 301. Bit line selection circuits 401–408 are also programmed to select the use of a first set of bit lines (e.g., bit lines 541 and 542), or a second set bit lines (e.g., bit lines 543 and 544). The first set of bit lines are used when a relatively small number of memory tiles are concatenated to form a memory array. The second set of bit lines are used when a larger number of memory tiles are concatenated to form a memory array. Typically, when a multiple of four memory tiles are to be concatenated, the second set of bit lines are used. The second set of bit lines introduce less signal delay than the first set of bit lines. In one embodiment, one pass transistor delay per memory tile is introduced by the first set of bit lines and one pass transistor delay per four memory tiles is introduced by the second set of bit lines.

Address bit selection circuits 1–4, memory tile selection circuit 5, and bit line selection circuits 401–408 determine whether memory tile 302 operates as an initial memory tile or as a concatenated memory tile. An initial memory tile is a memory tile which either operates independently of the other memory tiles, or operates as the first memory tile in a chain of concatenated memory tiles. Thus, memory tile 302 would be an initial memory tile in a 16-byte memory which includes only memory tile 302. Likewise, memory tile 302 would be an initial memory tile in a 64-byte memory which includes the series combination of memory tile 302 and subsequent memory tiles 303–305. Memory tile 302 would be considered a concatenated memory tile in any memory which includes the series combination of previous memory tile 301 and memory tile 302.

Address bit selection circuits 1–4, memory tile selection circuit 5 and bit line selection circuits 401–408 are described in more detail below.

Figure 5A:
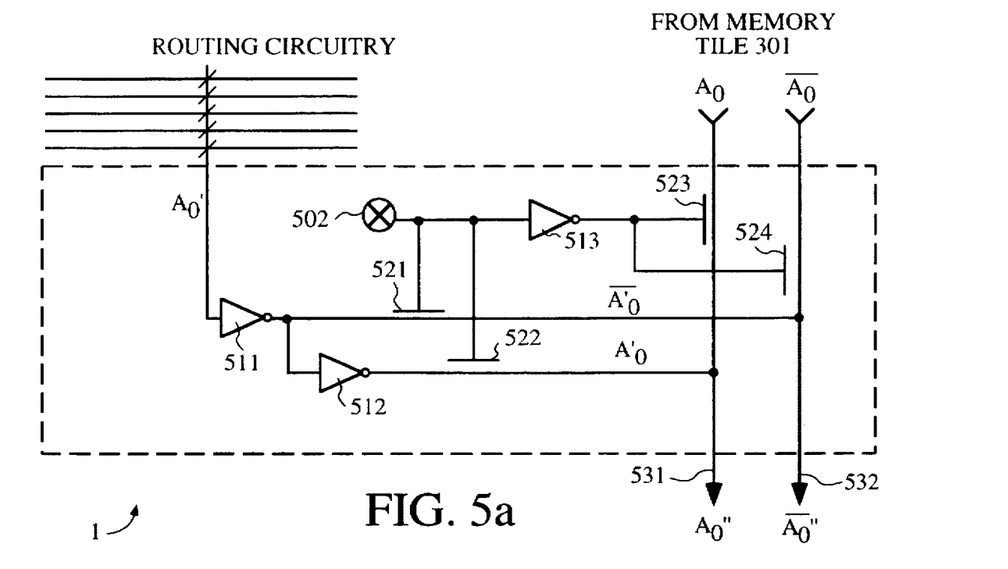
FIGS. 5a and 5b are schematic diagrams of address bit selection circuits in accordance with two embodiments of the invention.

FIG. 5a is a schematic diagram of address bit selection circuit 1. Address bit selection circuits 2–4 are identical to address bit selection circuit 1. Address bit selection circuit 1 includes configurable bit latch 502, inverters 511–513, pass transistors 521–524 and word select lines 531 and 532.

To program memory tile 302 to operate as a concatenated memory tile, address bit selection circuit 1 is programmed to provide address signals $A_0$ and $\overline{A}_0$ from previous memory tile 301 to word select lines 531 and 532, respectively. To do this, configurable bit latch 502 is programmed to provide a logic "0" value to the gates of pass transistors 521 and 522. As a result, pass transistors 521 and 522 are turned off, thereby preventing the address signal $A_A{}'$ (received from the routing circuitry) from being routed to word select line 531 and preventing address signal $\overline{A}_0{}'$ from being routed to word select line 532. The logic "0" value provided by configurable bit latch 502 is also provided to inverter 513, causing a logic "1" signal to be provided to the gates of pass transistors 523 and 524. As a result, pass transistors 523 and 524 are turned on and the address signals $A_0$ and $\overline{A}_0$ from previous memory tile 301 are provided to word select lines 531 and 532 as address signals $A_0{}''$ and $\overline{A}_0{}''$, respectively.

To program memory tile 302 to operate as an initial memory tile, address bit selection circuit 1 is programmed to provide address signal $A_0$ and the inverse of address signal $A_0{}'$ (i.e., $\overline{A}_0{}'$) from the routing circuitry to word select lines 531 and 532, respectively. To accomplish this, address signal $A_0{}'$ is routed from the routing circuitry to the input terminal of inverter 511 (using, for example, conventional pass transistors and/or multiplexers), and configurable bit latch 502 is programmed to provide a logic "1" value to the gates of pass transistors 521 and 522. The logic "1" value provided by configurable bit latch 502 causes pass transistors 521 and 522 to turn on. In this manner, address signal $A_0{}'$ is routed through inverters 511 –512 and pass transistor 522 to word select line 531 as address signal $A_0{}''$. In addition, by routing address signal $A_0{}'$ through inverter 511 and pass transistor 521, the inverse of address signal $A_0{}'$ is provided to word select line 532 as address signal $\overline{A}_0{}''$.

In the initial memory tile configuration, configurable bit latch 502 also provides a logic "1" value to inverter 513. As a result, a logic "0" value is provided to the gates of pass transistors 523 and 524, thereby turning off pass transistors 523 and 524. As a result, address signals $A_0$ and $\overline{A}_0$ are prevented from being transmitted to word select lines 531 and 532.

Figure 5B:
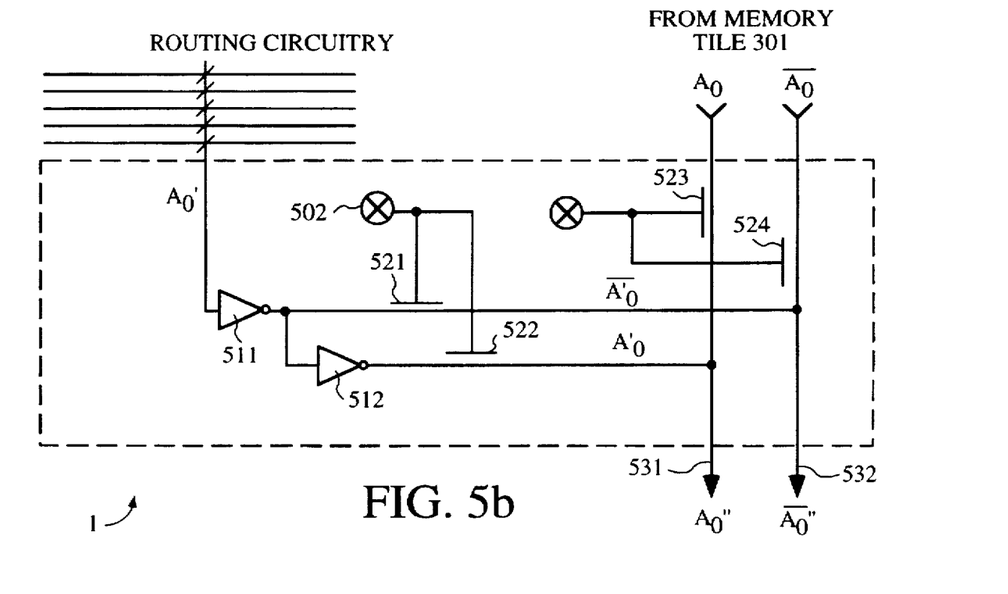

FIG. 5b is a schematic diagram of address bit selection circuit 1 in accordance with an alternative embodiment. Similar elements in FIGS. 5a and 5b are labeled with similar reference numbers. The address bit selection circuit 1 of FIG. 5b includes an additional configurable bit latch 503 which is coupled to the gates of pass transistors 523 and 524. Configurable bit latch 503 thereby allows pass transistors 523 and 524 to be controlled independently. The address bit selection circuit 1 of FIG. 5b allows the same modes of operation as the address bit selection circuit 1 of FIG. 5a, and also provides one additional mode. If configurable bit latches are both programmed to provide logic "1" values, then pass transistors 521–524 are all turned on. This allows address signal $A_0{}'$ and its inverse ($\overline{A}_0{}'$) to be transmitted to subsequent memory tile 303 as address signals $A_0{}''$ and $\overline{A}_0{}''$ and also to previous memory tile 301 as address signals $A_0$ and $\overline{A}_0$. If configurable bit latches are both programmed to provide logic "0" values, then pass transistors 521–524 are all turned off, thereby disconnecting tile 302 from memory tile 301 above, permitting memory tile 301 to be used independently. Thus, tile 302 is driven from tile 303 or some other lower tile. In this manner, the address bit selection circuit 1 of FIG. 5b provides additional flexibility in routing address signals.

Address bit selection circuits 2–4 operate in the same manner as address bit selection circuit 1. As a result, four address signals $A_0{}''$–$A_3{}''$ and their complements $\overline{A}_0{}''$–$\overline{A}_3{}''$ are provided to word select lines 531–538. Address signals $A_0{}''$–$A_3{}''$ and $\overline{A}_0{}''$–$\overline{A}_3{}''$ are used to address the 16 bytes of memory tile 302 by selectively providing these address signals to NOR gates 421–436. The interconnections made between word select lines 531–538 and NOR gates 421–436 for this addressing scheme are illustrated in FIG. 4. Thus, if signals $A_0{}''$–$A_3{}''$ are all logic "0" values (and signals $\overline{A}_0{}''$–$\overline{A}_3{}''$ are all logic "1" values), then the output signal of NOR gate 421 is a logic "1" value, and the output signals of NOR gates 422–436, are all logic "0" values. As described in more detail below, this allows access to the first row of memory cells $MC_0$–$MC_7$ of memory tile 302 (assuming that memory tile 302 is selected by memory tile selection circuit 5).

Address signals $A_0{}''$–$A_3{}''$ and $\overline{A}_0{}''$–$\overline{A}_3{}''$ are provided to subsequent memory tile 303 (FIG. 3). If memory tile 303 is to operate as a concatenated memory tile, address bit selection circuits (not shown) in memory tile 303 are programmed to select these address signals $A_0{}''$–$A_3{}''$ and $\overline{A}_0{}''$–$\overline{A}_3{}''$ for use within memory tile 303. Alternatively, if memory tile 303 is to operate as an initial memory tile, the address bit selection circuits of memory tile 303 are programmed to select address signals $A_0{}'''$–$A_3{}'''$ for use within memory tile 303.

Figure 6:
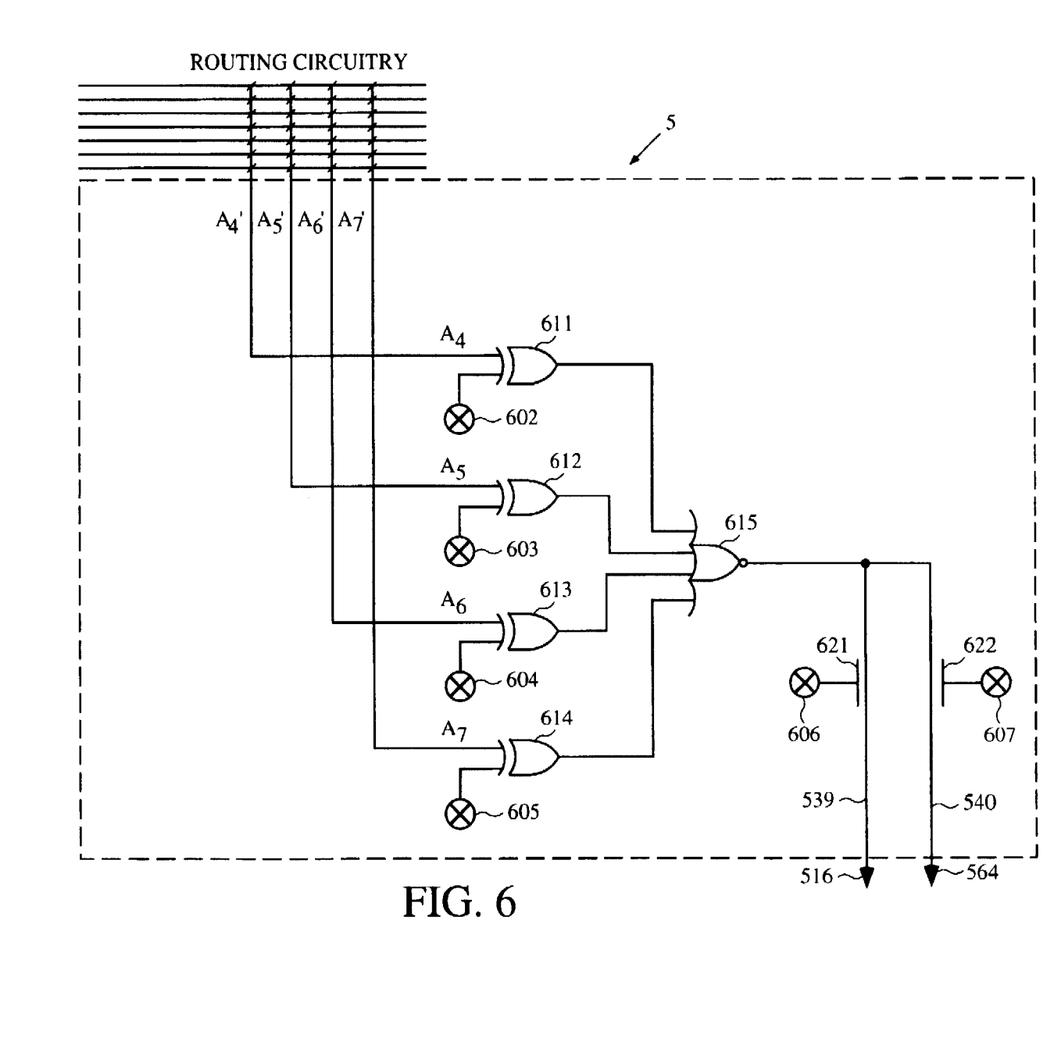
FIG. 6 is a schematic diagram of a memory tile selection circuit in accordance with one embodiment of the invention.

FIG. 6 is a schematic diagram of memory tile selection circuit 5 which includes configurable bit latches 602–607, exclusive OR gates 611–614, 4-input NOR gate 615 and pass transistors 621 and 622. The routing circuitry is programmed (using, for example, conventional pass transistors and/or multiplexers) to provide upper address signals $A_4{}'$–$A_7{}'$ from the routing circuitry to input terminals of exclusive OR gates 611–614, respectively. If memory tile 302 is to be operated as a concatenated memory tile, the routing circuitry is configured such that each of the concatenated memory tiles receive the same upper address signals.

Configurable bit latches 602–605 are programmed to provide signals which are representative of the particular address selected for memory tile 302. For example, if memory tile 302 is assigned an address of 0001 (i.e., $A_7{}'=0$, $A_6{}'=0$, $A_5{}'=0$, and $A_4{}'=1$), configurable bit latch 602 is programmed to provide a logic "1" value to exclusive OR gate 611 and configurable bit latches 603–605 are programmed to provide logic "0" values to exclusive OR gates 612–614, respectively. Thus, when address signals $A_7{}'$, $A_6{}'$, $A_5{}'$ and $A_4{}'$ have logic "0", "0", "0", and "1" values, respectively, the output signals from exclusive OR gates 611–614 are all logic "0" values. Four-input NOR gate 615 receives these logic "0" values, and in response, provides an output signal having a logic "1" value. The NOR gate 615 will only provide a logic "1" value when address signals $A_4{}'$–$A_7{}'$ correspond to the values programmed in configurable bit latches 602–605. The four address signals $A_4{}'$–$A_7{}'$ are capable of addressing each of the sixteen memory tiles 301–316 in composable RAM stripe 201.

The output signal from NOR gate 615 is either routed through pass transistor 621 to port select line 539 as port select signal $S_{16}$, or routed through pass transistor 622 to port select line 540 as port select signal $S_{64}$. Pass transistors 621 and 622 are controlled by configurable bit latches 606 and 607, respectively. Port select line 539 is coupled to the gates of a first group of pass transistors 551-566 (FIG. 4) and port select line 540 is coupled to the gates of a second group of pass transistors 571-586. When memory tile select circuit 5 is programmed to provide port select signal $S_{16}$, and port select signal $S_{16}$ has a logic "1" value, pass transistors 551-566 are turned on. When pass transistors 551-566 are turned on, the word select signals generated by NOR gates 421-436 (FIG. 4) are provided to enable the first ports of memory cells $MC_0$-$MC_{127}$.

Similarly, when memory tile select circuit 5 is programmed to provide port select signal $S_{64}$, and port select signal $S_{64}$ has a logic "1" value, pass transistors 571-586 are turned on. As a result, the word select signals generated by NOR gates 421-436 (FIG. 4) are provided to enable the second ports of memory cells $MC_0$-$MC_{127}$.

Figure 7:
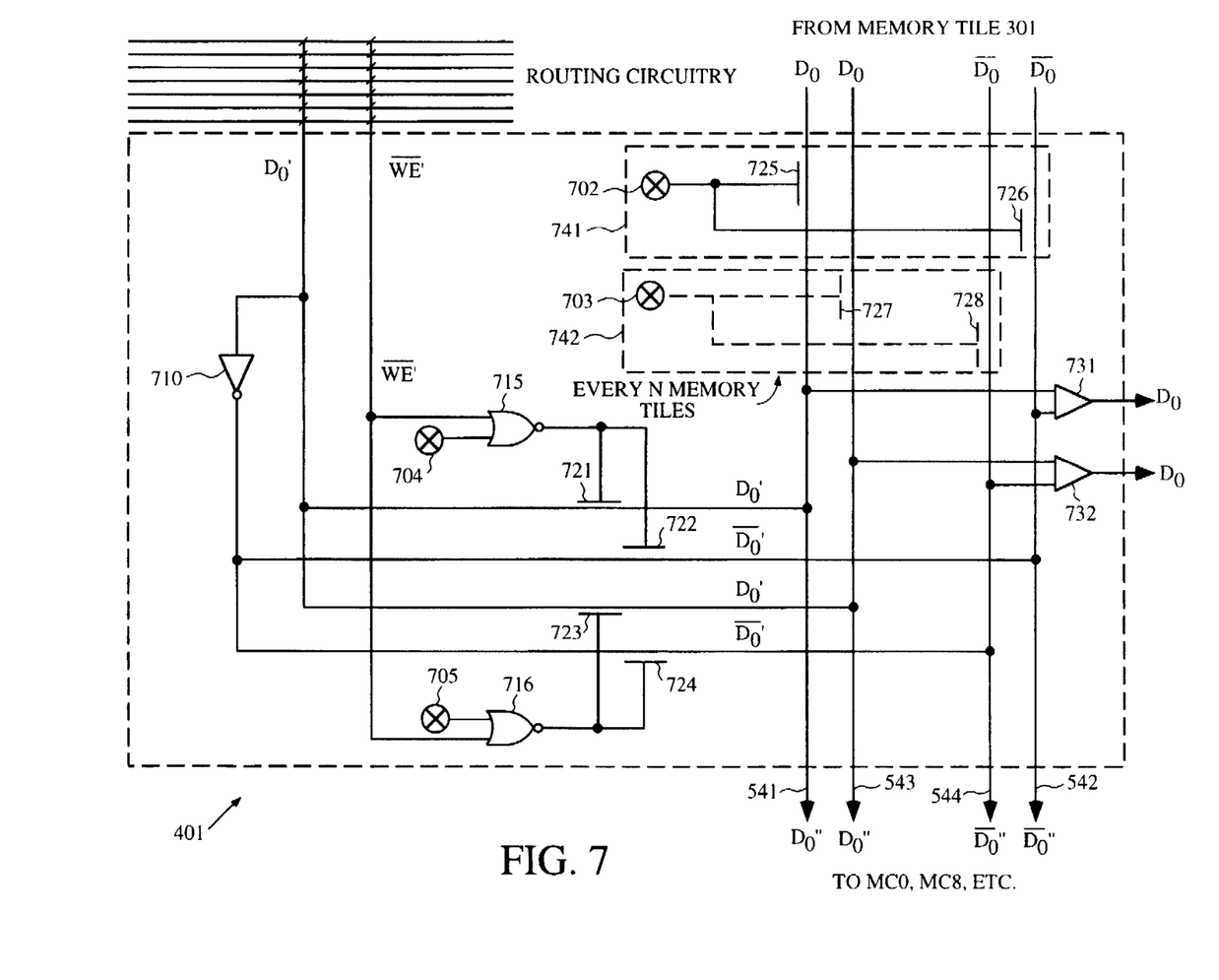
FIG. 7 is a schematic diagram of a bit line select circuit in accordance with one embodiment of the invention.

FIG. 7 is a schematic diagram of bit line select circuit 401. Bit line select circuits 402-408 are substantially identical to bit line select circuit 401. Bit line select circuit 401 includes configurable bit latches 702-705, inverter 710, NOR gates 715-716, pass transistors 721-728, sense amplifiers 731-732 and bit lines 541-544. Configurable bit latch 702 and pass transistors 725 and 726 form a first configuration circuit 741 and configurable bit latch 703 and pass transistors 727 and 728 form a second configuration circuit 742. Bit line select circuit 401 receives data signal $D_0{}'$ and write enable signal $\overline{WE}$ from the routing circuitry and data signals $D_0$ and $\overline{D}_0$ from previous memory tile 301.

Bit line select circuit 401 is programmed to determine (1) whether data signals $D_0$ and $\overline{D}_0$ or data signals $D_0{}'$ and $\overline{D}_0{}'$ are transmitted through bit line selection circuit 401 as data signals $D_0{}''$ and $\overline{D}_0{}''$, and (2) whether data signals $D_0{}''$ and $\overline{D}_0{}''$ are transmitted on first bit lines 541 and 542 or on second bit lines 543 and 544. The first bit lines include the bit lines, such as bit lines 541 and 542, which are coupled to the first ports of memory cells $MC_0$-$MC_{127}$. The second bit lines include bit lines, such as bit lines 543 and 544, which are coupled to the second ports of memory cells $MC_0$-$MC_{127}$. As described in more detail below, the first or second set of bit lines are selected based on the number of memory tiles 301-316 which are to be concatenated.

Bit line select circuits 401-408 must be programmed in a manner consistent with memory tile select circuit 5. For example, if bit line select circuits 401-408 are programmed to select the first bit lines (which are coupled to the first ports of memory cells $MC_0$-$MC_{127}$), then memory tile select circuit 5 must be programmed to provide port select signal $S_{16}$ (which provides access to the first ports of memory cells $MC_0$-$MC_{127}$ by enabling pass transistors 551-566).

Memory tile 302 can be programmed to be an initial memory tile in a series concatenation which also includes any consecutive number of memory tiles 303-316. If memory tile 302 is to operated as an initial memory tile, configurable bit latch 702 and optional configurable bit latch 703 (if present) are programmed to provide logic "0" values to the gates of pass transistors 725-728, thereby preventing bit line selection circuit 401 from passing data signals $D_0$ and $\overline{D}_0$ from previous memory tile 301. Although data signal $D_0$ is shown as existing on both bit line 541 (a first bit line) and bit line 543 (a second bit line) and data signal $\overline{D}_0$ is shown as existing on both bit line 542 (a first bit line) and bit line 544 (a second bit line), it is understood that data signal $D_0$ exists on either bit line 541 or bit line 543, but not on both of these bit lines. Similarly, data signal $\overline{D}_0$ exists on either bit line 542 or bit line 544, but not on both. Moreover, if data signal $D_0$ exists on bit line 541, then data signal $\overline{D}_0$ exists on bit line 542. Similarly, if data signal $D_0$ exists on bit line 543, then data signal $\overline{D}_0$ exists on bit line 544.

Still assuming that memory tile 302 is to be configured as an initial memory tile, one of configurable bit latches 704 and 705 is programmed to provide a logic "0" value and the other is programmed to provide a logic "1" value. If first bit lines 541 and 542 are to be selected, configurable bit latch 704 is programmed to provide a logic "0" value to NOR gate 715 and configurable bit latch 705 is programmed to provide a logic "1" value to NOR gate 716. The logic "1" value provided by configurable bit latch 705 forces the output signal of NOR gate 716 to a logic "0" value, thereby turning off pass transistors 723 and 724 and preventing data signals $D_0{}'$ and its inverse from being transmitted to bit lines 543 and 544.

In addition to receiving a logic "0" value from configurable bit latch 704, NOR gate 715 also receives write enable signal $\overline{WE}'$. Thus, write enable signal $\overline{WE}'$ controls the output signal of NOR gate 715, which in turn, controls pass transistors 721 and 722. When write enable signal $\overline{WE}'$ has a logic "0" value, the output signal of NOR gate 715 goes high, thereby turning on pass transistors 721 and 722. As a result, data signals $D_0$ and $\overline{D}_0{}'$ are transmitted to bit lines 541 and 542 as data signals $D_0{}''$ and $\overline{D}_0{}''$, respectively.

Data signals $D_0{}''$ and $\overline{D}_0{}''$, are transmitted to the first port each of the memory cells in the first column of the memory array in memory tile 302 (e.g., memory cells $MC_0$, $MC_8$, $MC_{16}$, $MC_{24}$, etc.) Data signals $D_0{}''$ and $\overline{D}_0{}''$, are also transmitted through memory tile 302 to memory tile 303. Memory tile 303 can be configured to operate as a concatenated memory tile. Configuration as a concatenated memory tile is described in more detail below in connection with memory tile 302.

If write enable signal $\overline{WE}'$ has a logic "1" value, pass transistors 721 and 722 are turned off. Under these conditions, data signals $D_0{}''$ and $\overline{D}_0{}''$ can be read out of an addressed memory cell to sense amplifier 731, which is coupled across bit lines 541 and 542.

Memory tile 302, when operated as an initial memory tile, can also be programmed to utilize second bit lines 543 and 544, instead of first bit lines 541 and 542. To do this, configurable bit latches 704 and 705 are programmed to provide logic "1" and logic "0" values, respectively.

If memory tile 302 is to be operated as a concatenated memory tile with previous memory tile 301, configurable bit latches 704 and 705 are programmed to provide logic "0" values to NOR gates 715 and 716, respectively. As a result, pass transistors 721-724 are turned off and data signals $D_0{}'$ and $\overline{D}_0{}'$, are prevented from being passed to bit lines 541-544. If previous memory tile 301 is programmed to provide data signals $D_0$ and $\overline{D}_0$ on first bit lines 541 and 542, configurable bit latch 702 is programmed to provide a logic "1" value to the gates of pass transistors 725 and 726, thereby turning these pass transistors on. Consequently, transistors 725 and 726 pass data signals $D_0$ and $\overline{D}_0$ to first bit lines 541 and 542 as data signals $D_0{}''$ and $\overline{D}_0{}''$, respectively.

Each of the bit line select circuits in memory tiles 301-316 includes circuitry which corresponds to first configuration circuit 741 of bit line select circuit 401. Thus, the first bit lines advantageously provide flexibility to concatenate any number of memory tiles 301–316. When the first bit lines are selected, each concatenated memory tile introduces a delay on the bit lines equal to the delay introduced by one pass transistor. For example, if memory tiles 301–303 are concatenated and the first bit lines are selected, a bit line delay corresponding to one pass transistor would be introduced by each of memory tiles 302 and 303 (for a total delay corresponding to two pass transistors). If all sixteen memory tiles 301–316 are concatenated and the first bit lines are selected, a total bit line delay corresponding to fifteen pass transistors would be introduced. Thus, while the first bit lines provide flexibility by allowing any number of the memory tiles to be concatenated, the bit line selection circuits which provide this flexibility causes non-trivial signal delay on the first bit lines. Thus, in accordance with one embodiment of present invention, the second bit lines include circuitry which allows a larger number of memory tiles to be concatenated with less bit line delay. This circuitry is illustrated in FIG. 7 as second configuration circuit 742. However, second configuration circuit 742 operates in a manner similar to first configuration circuit 741. Second configuration circuit 742 is not present in every memory tile, but rather in non-consecutive memory tiles. Although second configuration circuit 742 would typically not be included in memory tile 302, circuit 742 is shown in connection with memory tile 302 for ease of illustration. In one embodiment, memory tiles 305, 309, and 313 (FIG. 3) include a second configuration circuit 742. In such an embodiment, the second bit lines are used to form memory arrays which include groups of four memory tiles. For example, the second bit lines can be used to connect memory tiles 301–304 without introducing bit line delay due to pass transistors. In another example, the second bit lines can be used to connect memory tiles 305–312 and only introduce a bit line delay corresponding to the delay associated with a single pass transistor (present in memory tile 309). In yet another example, the second bit lines can be used to connect all of memory tiles 301–316 and only introduce a bit line delay corresponding to the delay associated with three pass transistors (present in memory tiles 305, 309 and 313). In the foregoing manner, the second bit lines are used to reduce the bit line delay (compared to the first bit lines) of larger concatenated memories.

Figure 8:
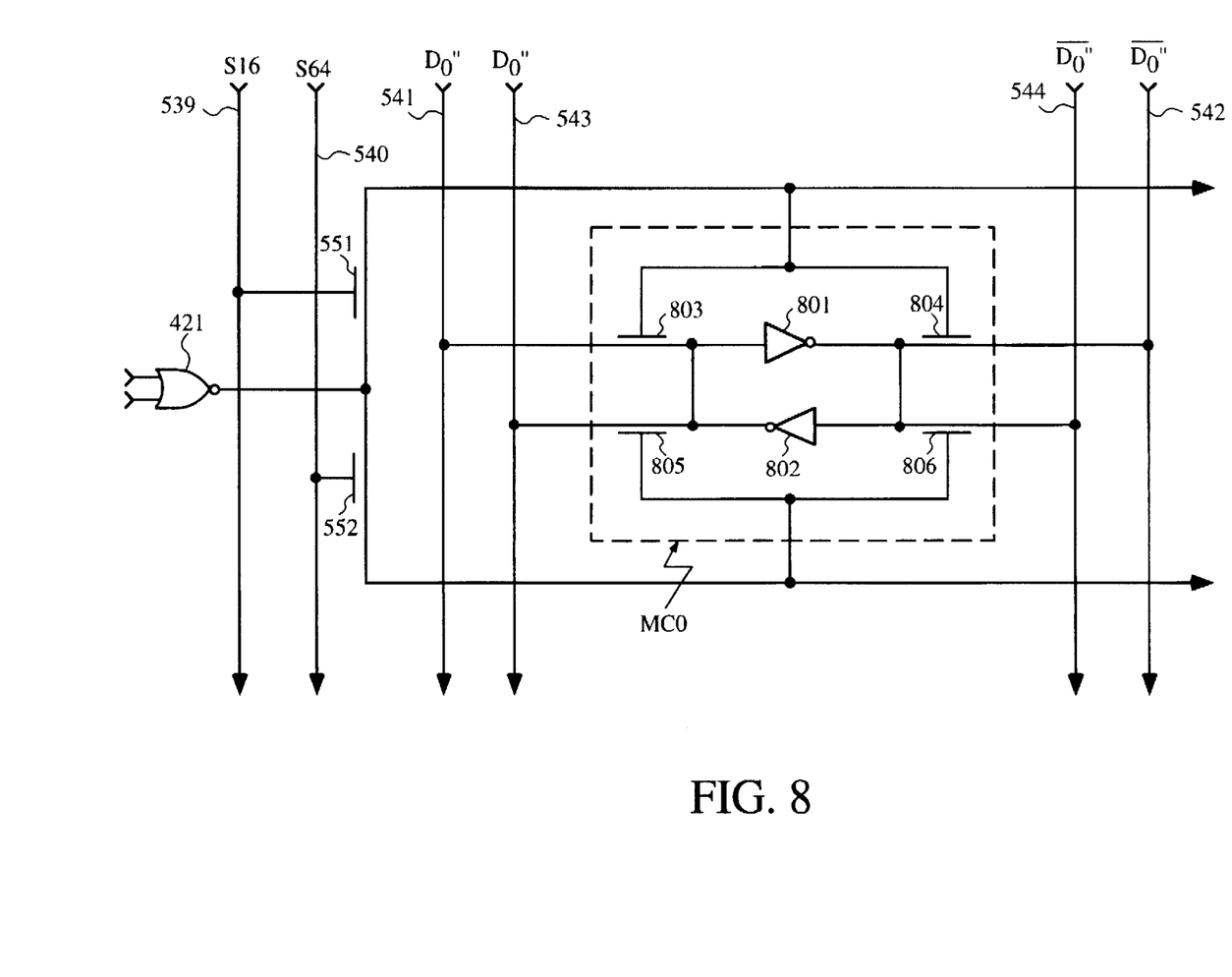
FIG. 8 is a schematic diagram of a dual-port SRAM memory cell connected in accordance with one embodiment of the invention.

FIG. 8 is a schematic diagram of dual-port SRAM memory cell MCO, wherein memory cells $MC_1$–$MC_{127}$ are identical to memory cell $MC_0$. Memory cell $MC_0$ includes inverters 801 and 802 which are coupled to form a latch. Memory cell $MC_0$ also includes pass transistors 803–805. The gates of pass transistors 803 and 804 are selectively connected to the output terminal of NOR gate 421 through pass transistor 551. The gates of pass transistors 805 and 806 are selectively connected to the output terminal of NOR gate 421 through pass transistor 552. Pass transistors 551 and 552 are controlled by port select signals $S_{16}$ and $S_{64}$, respectively.

As previously described in connection with FIG. 6, only one of port select signals $S_{16}$ and $S_{64}$ is selected for use by memory tile select circuit 5. The following example assumes that port select signal $S_{16}$ is selected. If port select signal $S_{16}$ has a logic "1" value, pass transistor 551 is turned on and the word select signal from NOR gate 421 is provided to pass transistors 803 and 804. When the word select signal from NOR gate 421 has a logic "1" value (i.e., when memory cell $MC_0$ is being addressed), pass transistors 803 and 804 are turned on. During a write operation, this causes the data signals on bit lines 541 and 542 to be applied to memory cell $MC_0$ and stored in the latch formed by inverters 801 and 802. During a read operation, this causes the data signals stored in memory cell $MC_0$ to be provided to sense amplifier 731 (FIG. 7). The port of memory cell $MC_0$ which is accessed by pass transistors 803 and 804 is arbitrarily defined as the first port of dual-port memory cell $MC_0$.

Conversely, when port select signal $S_{64}$ is selected for use, data signals on bit lines 543 and 544 are provided to memory cell $MC_0$ and stored in the latch formed by inverters 801 and 802 during a write operation. During a read operation, the data signals stored in memory cell $MC_0$ is provided to sense amplifier 732 (FIG. 7). The port of memory cell $MC_0$ which is accessed by pass transistors 805 and 805 is defined as the second port of dual-port memory cell $MC_0$.

When port select signal $S_{16}$ is selected for use, bit line select circuit 401 must be programmed to provide data values on first bit lines 541 and 542 (rather than on second bit lines 543 and 544). Moreover, when port select signal $S_{64}$ is selected for use, bit line select circuit 401 must be programmed to provide data values on second bit lines 543 and 544 (rather than on first bit lines 541 and 542).

Although the invention has been described in connection with several embodiments, it is understood that this invention is not limited to the embodiments disclosed, but is capable of various modifications which would be apparent to one of ordinary skill in the art. For example, composable RAM array 102 may be formed on a semiconductor device which does not include an array of CLBs. Thus, the invention is limited only by the following claims.

What is claimed is:

1. A composable memory array for a semiconductor device, the composable memory array comprising:
   a plurality of serially coupled memory tiles;
   an array of dual-port memory cells which extends through each of the memory tiles, the array having a plurality of columns of memory cells, and each of the memory cells having a first port and a second port;
   a plurality of bit lines, wherein each first bit line is coupled to the first ports of the memory cells in a corresponding column of the array; and
   a configuration circuit associated with each memory tile, wherein each first configuration circuit is programmable to establish or break a continuity of the bit lines.

2. The composable memory array of claim 1, wherein each of the memory tiles further comprises a bit line selection circuit which is programmable to select the bit lines.

3. The composable memory array of claim 2, wherein each of the bit selection circuits is coupled to receive a data signal and a write enable signal from circuitry of the semiconductor device, and each of the bit line selection circuits is programmable to a first state in which the data signal is not transmitted to the bit lines, and a second state in which the data signal is transmitted to the bit lines when the write enable signal is asserted.

4. The composable memory array of claim 1, wherein each of the memory tiles comprises an associated memory tile selection circuit coupled to receive a plurality of address signals from circuitry of the semiconductor device, and wherein each memory tile selection circuit comprises an address identification circuit which is programmable to store an address corresponding to the associated memory tile, wherein the memory tile selection circuit generates a port select signal when the address signals received from the circuitry of the semiconductor device match the address stored in the memory tile selection circuit.

5. The composable memory array of claim 4, wherein the port select signal enables the first port or the second port of the memory cells.

6. The composable memory array of claim 1, wherein each of the memory tiles comprises a plurality of address bit selection circuits, wherein each address bit selection circuit is coupled to receive an address signal from circuitry of the semiconductor device, and wherein each address bit selection circuit is further coupled to receive an address signal from another of the memory tiles, wherein each address bit selection circuit is programmable to route the address signal received from the circuitry of the semiconductor device or the address signal received from the other memory tile.

7. The composable memory array of claim 6, further comprising a decoding circuit coupled to receive the address signals routed by the address bit selection circuits, wherein the decoding circuit generates a word select signal used to access a memory cell.

8. The composable memory array of claim 1, wherein the semiconductor device is a programmable logic device.

9. A programmable logic device comprising:

an array of configurable logic blocks; and a dedicated composable memory array, wherein the array of configurable logic blocks and the composable memory array are located on the same chip.

10. The programmable logic device of claim 9, wherein the dedicated composable memory array comprises a plurality of independent memory stripes, each memory stripe having a plurality of serially connected memory tiles.

11. The programmable logic device of claim 9, wherein the dedicated composable memory array comprises a plurality of serially connected memory tiles.

12. A programmable logic device comprising:

an array of configurable logic blocks; and a dedicated composable memory array, wherein the array of configurable logic blocks and the composable memory array are located on the same chip, wherein the dedicated composable memory array comprises a plurality of serially connected memory tiles wherein each memory tile comprises:

an array of memory cells; and inter-tile logic which is programmable to selectively couple the array of memory cells of one memory tile to the array of memory cells of another memory tile.

13. The programmable logic device of claim 12, wherein the inter-tile logic comprises a plurality of bit line selection circuits which are programmable to couple bit lines corresponding to the array of memory cells of one memory tile to bit lines corresponding to the array of memory cells of another memory tile.

14. The programmable logic device of claim 12, wherein the inter-tile logic of each memory tile comprises a plurality of address bit selection circuits which are programmable to pass address signals from routing circuitry of the programmable logic device or from another memory tile to address the array of memory cells of the corresponding memory tile.

15. The programmable logic device of claim 12, wherein the inter-tile logic of each memory tile comprises a memory tile selection circuit which stores an address code corresponding to an address of the memory tile, wherein the memory tile selection circuit enables the array of memory cells of the memory tile to be accessed when an address received by the memory tile selection circuit matches the address code.

16. A method of implementing a composable memory array on a semiconductor device, the method comprising the steps of:

providing a plurality of memory tiles at a fixed location on the semiconductor device, wherein each memory tile comprises a plurality of columns of dual-port memory cells, with each memory cell having a first port and a second port;

coupling the first ports of the memory cells in each column of each memory tile to a corresponding one of a plurality of first bit lines;

coupling the second ports of the memory cells in each column of each memory tile to a corresponding one of a plurality of second bit lines;

selecting the first bit lines or the second bit lines to access the memory cells; and routing the selected bit lines to a first number of memory tiles, thereby forming a first memory array which includes the first number of the memory tiles.

17. The method of claim 16, wherein the first bit lines can be routed in increments of single memory tiles, and wherein the second bit lines can be routed in increments of multiple memory tiles.

18. The method of claim 16, further comprising the step of:

routing the selected bit lines to a second number of memory tiles, thereby forming a second memory array which includes the second number of the memory tiles.

19. A composable memory array for a semiconductor device, the composable memory array comprising:

a plurality of serially coupled memory tiles;

an array of dual-port memory cells which extends through each of the memory tiles, the array having a plurality of columns of memory cells, and each of the memory cells having a first port and a second port;

a plurality of first bit lines, wherein each first bit line is coupled to the first ports of the memory cells in a corresponding column of the array;

a plurality of second bit lines, wherein each second bit line is coupled to the second ports of the memory cells in a corresponding column of the array;

a first configuration circuit associated with each memory tile, wherein each first configuration circuit is programmable to establish or break a continuity of the first bit lines; and at least one second configuration circuit located in nonconsecutive memory tiles, wherein each second configuration circuit is programmable to establish or break a continuity of the second bit lines.

20. The composable memory array of claim 19, wherein each of the memory tiles further comprises a bit line selection circuit which is programmable to select the first bit lines or the second bit lines.

21. The composable memory array of claim 20, wherein each of the bit selection circuits is coupled to receive a data signal and a write enable signal from circuitry of the semiconductor device, and each of the bit line selection circuits is programmable to a first state in which the data signal is not transmitted to the first or second bit lines, a second state in which the data signal is transmitted to the first bit lines when the write enable signal is asserted, and a third state in which the data signal is transmitted to the second bit lines when the write enable signal is asserted.

* * * * *